United States Patent
Lin et al.

(10) Patent No.: US 9,508,668 B2
(45) Date of Patent: *Nov. 29, 2016

(54) CONDUCTIVE CONTACTS HAVING VARYING WIDTHS AND METHOD OF MANUFACTURING SAME

(71) Applicant: Taiwan Semiconductor Manufacturing Company, Ltd., Hsin-Chu (TW)

(72) Inventors: Yen-Liang Lin, Taichung (TW); Yu-Jen Tseng, Hsin-Chu (TW); Chang-Chia Huang, Hsin-Chu (TW); Tin-Hao Kuo, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/804,617

(22) Filed: Jul. 21, 2015

(65) Prior Publication Data

US 2015/0325542 A1 Nov. 12, 2015

Related U.S. Application Data

(63) Continuation of application No. 13/904,885, filed on May 29, 2013, now Pat. No. 9,105,530.

(60) Provisional application No. 61/707,644, filed on Sep. 28, 2012, provisional application No. 61/702,624, filed on Sep. 18, 2012, provisional application No. 61/707,609, filed on Sep. 28, 2012, provisional application No. 61/707,442, filed on Sep. 28, 2012.

(51) Int. Cl.
*H01L 23/00* (2006.01)
*H01L 21/768* (2006.01)
(Continued)

(52) U.S. Cl.
CPC ......... *H01L 24/13* (2013.01); *H01L 21/76885* (2013.01); *H01L 24/11* (2013.01);
(Continued)

(58) Field of Classification Search
CPC . H01L 24/13; H01L 21/76885; H01L 24/16; H01L 12/498; H01L 21/768; H01L 24/11; H01L 24/81; H01L 24/14; H01L 23/49811; H01L 21/4853; H01L 2224/13017; H01L 2224/13023; H01L 2224/13082; H01L 2224/13147; H01L 2224/13551; H01L 2224/13565
USPC ............... 257/737, 738, 778, 780, 783, 758, 257/E23.145, E21.579, E23.068; 438/613, 438/614

See application file for complete search history.

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

| CN | 101080138 A | 11/2007 |
| CN | 102254871 A | 11/2011 |

(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

(Continued)

*Primary Examiner* — Alexander Oscar Williams
(74) *Attorney, Agent, or Firm* — Slater Matsil, LLP

(57) ABSTRACT

A bump structure includes a contact element formed on a substrate and a passivation layer overlying the substrate. The passivation layer includes a passivation opening exposing the contact element. The bump structure also includes a polyimide layer overlying the passivation layer and an under bump metallurgy (UBM) feature electrically coupled to the contact element. The polyimide layer has a polyimide opening exposing the contact element, and the under bump metallurgy feature has a UBM width. The bump structure further includes a copper pillar on the under bump metallurgy feature. A distal end of the copper pillar has a pillar width, and the UBM width is greater than the pillar width.

20 Claims, 4 Drawing Sheets

(51) Int. Cl.
  *H01L 21/48* (2006.01)
  *H01L 23/498* (2006.01)

(52) U.S. Cl.
  CPC ............ *H01L 24/16* (2013.01); *H01L 24/81* (2013.01); *H01L 21/4853* (2013.01); *H01L 23/49811* (2013.01); *H01L 24/14* (2013.01); *H01L 2224/1112* (2013.01); *H01L 2224/11013* (2013.01); *H01L 2224/11462* (2013.01); *H01L 2224/11472* (2013.01); *H01L 2224/13015* (2013.01); *H01L 2224/13017* (2013.01); *H01L 2224/13023* (2013.01); *H01L 2224/1357* (2013.01); *H01L 2224/1369* (2013.01); *H01L 2224/13082* (2013.01); *H01L 2224/13083* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13551* (2013.01); *H01L 2224/13565* (2013.01); *H01L 2224/13582* (2013.01); *H01L 2224/13686* (2013.01); *H01L 2224/14051* (2013.01); *H01L 2224/16227* (2013.01); *H01L 2224/16238* (2013.01); *H01L 2224/16503* (2013.01); *H01L 2224/81007* (2013.01); *H01L 2224/8181* (2013.01); *H01L 2224/8192* (2013.01); *H01L 2224/81191* (2013.01); *H01L 2224/81424* (2013.01); *H01L 2224/81439* (2013.01); *H01L 2224/81444* (2013.01); *H01L 2224/81447* (2013.01); *H01L 2924/07025* (2013.01); *H01L 2924/181* (2013.01); *H01L 2924/301* (2013.01); *Y10T 29/49144* (2015.01)

(56) References Cited

U.S. PATENT DOCUMENTS

| | | |
|---|---|---|
| 5,075,253 A | 12/1991 | Sliwa, Jr. |
| 5,075,965 A | 12/1991 | Carey et al. |
| 5,130,779 A | 7/1992 | Agarwala et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,508,561 A | 4/1996 | Tago et al. |
| 5,542,601 A | 8/1996 | Fallon et al. |
| 5,587,337 A | 12/1996 | Idaka et al. |
| 5,680,187 A | 10/1997 | Nagayama et al. |
| 5,790,377 A | 8/1998 | Schreiber et al. |
| 5,796,591 A | 8/1998 | Dalal et al. |
| 5,816,478 A | 10/1998 | Kaskoun et al. |
| 5,889,326 A | 3/1999 | Tanaka |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,082,610 A | 7/2000 | Shangguan et al. |
| 6,091,141 A | 7/2000 | Heo |
| 6,130,476 A | 10/2000 | LaFontaine, Jr. et al. |
| 6,137,184 A | 10/2000 | Ikegami |
| 6,181,010 B1 | 1/2001 | Nozawa |
| 6,187,678 B1 | 2/2001 | Gaynes et al. |
| 6,229,216 B1 | 5/2001 | Ma et al. |
| 6,229,220 B1 | 5/2001 | Saitoh et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,346,469 B1 | 2/2002 | Greer |
| 6,355,501 B1 | 3/2002 | Fung et al. |
| 6,358,847 B1 | 3/2002 | Li et al. |
| 6,424,037 B1 | 7/2002 | Ho et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,492,197 B1 | 12/2002 | Rinne |
| 6,498,308 B2 | 12/2002 | Sakamoto |
| 6,562,653 B1 | 5/2003 | Ma et al. |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,600,222 B1 | 7/2003 | Levardo |
| 6,607,938 B2 | 8/2003 | Kwon et al. |
| 6,661,085 B2 | 12/2003 | Kellar et al. |
| 6,713,844 B2 | 3/2004 | Tatsuta |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,192,803 B1 | 3/2007 | Lin et al. |
| 7,215,033 B2 | 5/2007 | Lee et al. |
| 7,245,023 B1 | 7/2007 | Lin |
| 7,251,484 B2 | 7/2007 | Aslanian |
| 7,271,483 B2 | 9/2007 | Lin et al. |
| 7,271,484 B2 | 9/2007 | Reiss et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |
| 7,576,435 B2 | 8/2009 | Chao |
| 7,659,631 B2 | 2/2010 | Kamins et al. |
| 7,804,177 B2 | 9/2010 | Lu et al. |
| 7,834,450 B2 | 11/2010 | Kang |
| 7,946,331 B2 | 5/2011 | Trezza et al. |
| 8,076,232 B2 | 12/2011 | Pendse |
| 8,093,729 B2 | 1/2012 | Trezza |
| 8,120,175 B2 | 2/2012 | Farooq et al. |
| 8,130,475 B2 | 3/2012 | Kawamori et al. |
| 8,158,489 B2 | 4/2012 | Huang et al. |
| 8,207,604 B2 | 6/2012 | Haba et al. |
| 8,232,640 B2 | 7/2012 | Tomoda et al. |
| 8,258,055 B2 | 9/2012 | Hwang et al. |
| 8,435,881 B2 | 5/2013 | Choi et al. |

(56) References Cited

U.S. PATENT DOCUMENTS

| | | |
|---|---|---|
| 9,105,530 B2 * | 8/2015 | Lin .................. H01L 21/76885 |
| 2001/0013423 A1 | 8/2001 | Dalal et al. |
| 2001/0038147 A1 | 11/2001 | Higashi et al. |
| 2002/0033412 A1 | 3/2002 | Tung |
| 2002/0084528 A1 | 7/2002 | Kim et al. |
| 2002/0100974 A1 | 8/2002 | Uchiyama |
| 2002/0106832 A1 | 8/2002 | Hotchkiss et al. |
| 2002/0197811 A1 | 12/2002 | Sato |
| 2003/0092219 A1 | 5/2003 | Ouchi et al. |
| 2003/0218250 A1 | 11/2003 | Kung et al. |
| 2004/0007779 A1 | 1/2004 | Arbuthnot et al. |
| 2004/0140538 A1 | 7/2004 | Harvey |
| 2004/0159944 A1 | 8/2004 | Datta et al. |
| 2004/0212098 A1 | 10/2004 | Pendse |
| 2005/0062153 A1 | 3/2005 | Saito et al. |
| 2005/0212114 A1 | 9/2005 | Kawano et al. |
| 2005/0224991 A1 | 10/2005 | Yeo |
| 2005/0253264 A1 | 11/2005 | Aiba et al. |
| 2006/0012024 A1 | 1/2006 | Lin et al. |
| 2006/0038303 A1 | 2/2006 | Sterrett et al. |
| 2006/0051954 A1 | 3/2006 | Lin et al. |
| 2006/0055032 A1 | 3/2006 | Chang et al. |
| 2006/0076677 A1 | 4/2006 | Daubenspeck et al. |
| 2006/0209245 A1 | 9/2006 | Mun et al. |
| 2006/0223313 A1 | 10/2006 | Yoon et al. |
| 2006/0292824 A1 | 12/2006 | Beyne et al. |
| 2007/0001280 A1 | 1/2007 | Hua |
| 2007/0012337 A1 | 1/2007 | Hillman et al. |
| 2007/0018294 A1 | 1/2007 | Sutardja |
| 2007/0020906 A1 | 1/2007 | Chiu et al. |
| 2007/0023483 A1 | 2/2007 | Yoneyama et al. |
| 2007/0045840 A1 | 3/2007 | Varnau |
| 2007/0057022 A1 | 3/2007 | Mogami et al. |
| 2007/0114663 A1 | 5/2007 | Brown et al. |
| 2007/0200234 A1 | 8/2007 | Gerber et al. |
| 2008/0003402 A1 | 1/2008 | Haba et al. |
| 2008/0023850 A1 | 1/2008 | Lu et al. |
| 2008/0128911 A1 | 6/2008 | Koyama |
| 2008/0150135 A1 | 6/2008 | Oyama et al. |
| 2008/0169544 A1 | 7/2008 | Tanaka et al. |
| 2008/0194095 A1 | 8/2008 | Daubenspeck et al. |
| 2008/0218061 A1 | 9/2008 | Chao et al. |
| 2008/0277785 A1 | 11/2008 | Hwan et al. |
| 2009/0025215 A1 | 1/2009 | Murakami et al. |
| 2009/0042144 A1 | 2/2009 | Kitada et al. |
| 2009/0075469 A1 | 3/2009 | Furman et al. |
| 2009/0096092 A1 | 4/2009 | Patel |
| 2009/0108443 A1 | 4/2009 | Jiang |
| 2009/0149016 A1 | 6/2009 | Park et al. |
| 2009/0166861 A1 | 7/2009 | Lehr et al. |
| 2009/0174067 A1 | 7/2009 | Lin |
| 2009/0218702 A1 | 9/2009 | Beyne et al. |
| 2009/0250814 A1 | 10/2009 | Pendse et al. |
| 2010/0007019 A1 | 1/2010 | Pendse |
| 2010/0044860 A1 | 2/2010 | Haba et al. |
| 2010/0141880 A1 | 6/2010 | Koito et al. |
| 2010/0193944 A1 | 8/2010 | Castro et al. |
| 2010/0200279 A1 | 8/2010 | Kariya et al. |
| 2010/0252926 A1 | 10/2010 | Kato et al. |
| 2010/0258950 A1 | 10/2010 | Li et al. |
| 2010/0276787 A1 | 11/2010 | Yu et al. |
| 2010/0314745 A1 | 12/2010 | Masumoto et al. |
| 2010/0327422 A1 | 12/2010 | Lee et al. |
| 2011/0001250 A1 | 1/2011 | Lin et al. |
| 2011/0024902 A1 | 2/2011 | Lin et al. |
| 2011/0038147 A1 | 2/2011 | Lin et al. |
| 2011/0169158 A1 | 7/2011 | Varanasi |
| 2011/0177686 A1 | 7/2011 | Zeng et al. |
| 2011/0186986 A1 | 8/2011 | Chuang et al. |
| 2011/0193220 A1 | 8/2011 | Kuo et al. |
| 2011/0244675 A1 | 10/2011 | Huang et al. |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007230 A1 | 1/2012 | Hwang et al. |
| 2012/0007231 A1 | 1/2012 | Chang |
| 2012/0012997 A1 | 1/2012 | Shen et al. |
| 2012/0040524 A1 | 2/2012 | Kuo et al. |
| 2012/0049346 A1 | 3/2012 | Lin et al. |
| 2012/0091577 A1 | 4/2012 | Hwang et al. |
| 2012/0098120 A1 | 4/2012 | Yu et al. |
| 2012/0098124 A1 | 4/2012 | Wu et al. |
| 2012/0146168 A1 | 6/2012 | Hsieh et al. |
| 2012/0306080 A1 | 12/2012 | Yu et al. |
| 2013/0026622 A1 | 1/2013 | Chuang et al. |
| 2013/0087920 A1 | 4/2013 | Jeng et al. |
| 2013/0093079 A1 | 4/2013 | Tu et al. |
| 2013/0270699 A1 | 10/2013 | Kuo et al. |
| 2013/0277830 A1 | 10/2013 | Yu et al. |
| 2013/0288473 A1 | 10/2013 | Chuang et al. |
| 2014/0054764 A1 | 2/2014 | Lu et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077359 A1 | 3/2014 | Tsai et al. |
| 2014/0077360 A1 | 3/2014 | Lin et al. |
| 2014/0077365 A1 | 3/2014 | Lin et al. |
| 2014/0264890 A1 | 9/2014 | Breuer et al. |
| 2014/0353820 A1 * | 12/2014 | Yu ........................... H01L 24/13 |
| | | 257/737 |

FOREIGN PATENT DOCUMENTS

| | | |
|---|---|---|
| CN | 102468197 A | 5/2012 |
| EP | 1387402 A2 | 2/2004 |
| KR | 1020110002816 A | 1/2011 |
| KR | 1020110128532 A | 11/2011 |
| TW | 200826265 A | 6/2008 |
| TW | 200915452 A | 4/2009 |
| TW | 201133662 | 10/2011 |
| TW | 201143007 | 12/2011 |
| WO | 2009140238 | 11/2009 |

OTHER PUBLICATIONS

U.S. Appl. No. 12/784,266, filed May 20, 2010.
U.S. Appl. No. 13/653,618, filed Oct. 17, 2012.
U.S. Appl. No. 13/734,811, filed Jan. 4, 2013.
U.S. Appl. No. 13/712,722, filed Dec. 12, 2012.
U.S. Appl. No. 13/904,885, filed Dec. 12, 2012.
U.S. Appl. No. 13/744,361, filed Jan. 17, 2013.
U.S. Appl. No. 13/449,078, filed Apr. 17, 2012.

* cited by examiner

CONDUCTIVE CONTACTS HAVING VARYING WIDTHS AND METHOD OF MANUFACTURING SAME

CROSS-REFERENCE TO RELATED APPLICATIONS

This application is a continuation of application Ser. No. 13/904,885, filed on May 29, 2013, entitled "Conductive Contacts Having Varying Widths and Method of Manufacturing Same," which claims the benefit of U.S. Provisional Application No. 61/707,644, filed on Sep. 28, 2012, entitled "Metal Bump and Method of Manufacturing Same," of U.S. Provisional Application No. 61/702,624, filed on Sep. 18, 2012, entitled "Ladd Bump Structures and Methods of Making the Same," of U.S. Provisional Application No. 61/707,609, filed on Sep. 28, 2012, entitled "Interconnection Structure Method of Forming Same," and of U.S. Provisional Application No. 61/707,442, filed on Sep. 28, 2012, entitled "Bump Structure and Method of Forming Same," which applications are hereby incorporated herein by reference.

This application relates to the following co-pending and commonly assigned patent applications: U.S. patent application Ser. No. 13/712,722, filed Dec. 12, 2012 entitled "Bump Structure and Method of Forming Same," U.S. patent application Ser. No. 13/734,811, filed Jan. 4, 2013 entitled "Ladder Bump Structure and Method of Forming Same," and U.S. patent application Ser. No. 13/744,361, filed Jan. 17, 2013 entitled "Interconnection Structure and Method of Forming Same," each of which claim priority to U.S. Provisional Application No. 61/707,644, U.S. Provisional Application No. 61/702,624, U.S. Provisional Application No. 61/707,609, and U.S. Provisional Application No. 61/707,442, which applications are hereby incorporated herein by reference.

BACKGROUND

Generally, in the development of increasingly denser integrated circuit (IC) packaging, as pitch between adjacent connectors (e.g., metal bumps) decreases, the feature size of under bump metallurgy (UBM) also decreases. Concomitantly, the size of the opening in the overlying layers, such as the polyimide (PI) layer decreases as well. This results in higher contact resistance (Rc).

In order to have more bump cell design flexibility, an innovated bump structure is needed, preferably a structure that also provides meet low stress impact on underlying layers, such as extremely low-k (ELK) dielectric, passivation layers, and the like.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a ladder bump structure for a bump on trace (BOT) assembly. The concepts in the disclosure may also apply, however, to other semiconductor structures or circuits.

Figure 1:
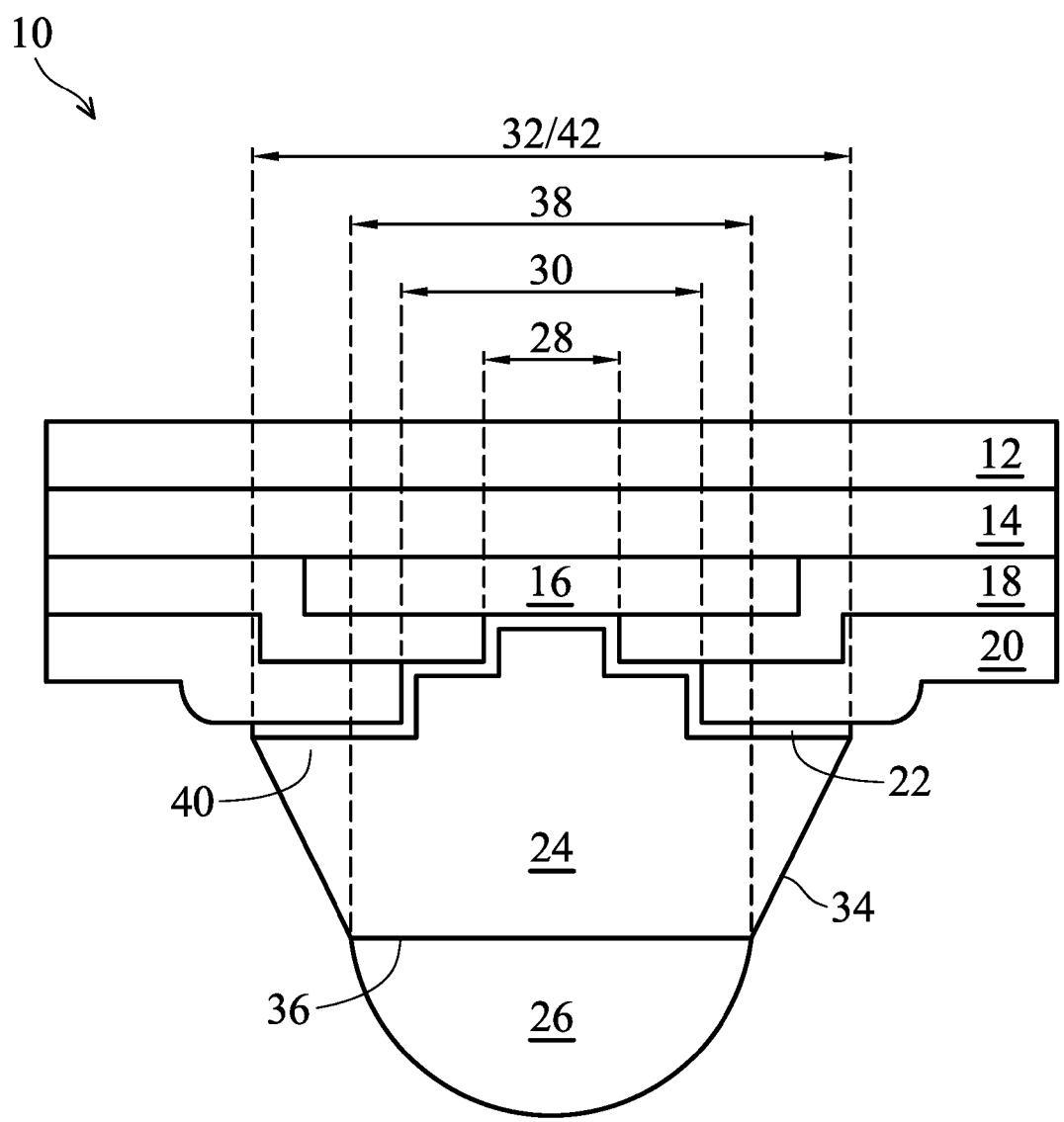
FIG. 1 is a cross sectional view of an embodiment ladder bump structure.

Referring now to FIG. 1, an embodiment ladder bump structure 10 is illustrated. As shown, the ladder bump structure 10 includes a substrate 12, an insulating layer 14, a contact element 16, a passivation layer 18, a polyimide layer 20, an under bump metallurgy (UBM) feature 22, a copper pillar 24, and a solder feature 26.

The substrate 12 may be, for example, a silicon wafer or silicon-containing layer of material. In an embodiment, the substrate 12 may be, for instance, a top layer of an integrated circuit device, such as a top metal layer a passivation layer, or the like. In an embodiment, an integrated circuit (not shown) is formed on and/or in the substrate 12, as is known in the art. Various layers and features of the substrate 12, including transistors, interconnect layers, post passivation interconnects, redistribution layers, and the like are omitted from the figures for the sake of clarity, as they are not necessary to an understanding of the present disclosure.

Still referring to FIG. 1, the substrate 12 supports insulating layer 14. In an embodiment, the insulating layer 14 is an extremely low-k (ELK) dielectric. As shown, the insulating layer 14 generally supports the contact element 16. In an embodiment, the contact element 16 is a metal pad (e.g., an aluminum pad). In an embodiment, the contact element 16 comprises another suitable metal or conductive material.

Still referring to FIG. 1, the passivation layer 18 is formed over the insulating layer 14 and the substrate 12. In other words, the passivation layer 18 overlies the insulating layer 14 and the substrate 12. As shown, the passivation layer 18 extends over outer portions of the contact element 16. In an embodiment, the passivation layer 18 abuts or directly engages the contact element 16. The passivation layer 18 also defines a passivation opening 28, which exposes the underlying the contact element 16. In an embodiment, the passivation opening 28 is between about 12.5 µm to about 37.5 µm.

Still referring to FIG. 1, the polyimide layer 20 is formed over the passivation layer 18. In other words, the polyimide layer 20 overlies the passivation layer 18. As shown, the polyimide layer 20 extends over outer portions of the contact element 16. In an embodiment, portions of the passivation layer 18 are interposed between the polyimide layer 20 and the contact element 16. The polyimide layer 20 also defines a polyimide opening 30, which exposes the underlying the contact element 16. In an embodiment, the polyimide opening 30 is between about 25 µm to about 75 µm.

Still referring to FIG. 1, the UBM feature 22 is electrically coupled to the contact element 16. In an embodiment, the UBM feature 22 is formed from titanium (Ti), titanium nitride (TiN) copper nickel (CuNi), aluminum (Al), and the like to a thickness of, perhaps, about 0.1 µm to about 5 µm, depending on the application. In an embodiment, the UBM feature 22 is mounted so as abut or engage with portions of the polyimide layer 20, the passivation layer 18, and the contact element 16. As shown, the UBM feature 22 defines a UBM width 32. The UBM width 32 (a.k.a., the UBM opening) is generally the lateral or horizontal length of the UBM feature 22 as oriented and depicted in FIG. 1.

Still referring to FIG. 1, the copper pillar 24 (a.k.a., bump) is disposed or mounted on the UBM feature 22. In an embodiment, instead of being formed from copper the pillar 24 may be formed from another material such as, for example, tin, aluminum, or another suitable material. In an embodiment, a metal oxide (e.g., cupric oxide, CuO, cuprous oxide, $Cu_2O$, aluminum oxide, $Al_2O_3$, etc.) is formed on sidewalls 34 of the copper pillar 24. A distal end 36 of the copper pillar 24, which is the end furthest from the substrate 12, defines a pillar width 38. The pillar width 38 is generally the lateral or horizontal length of the distal end 36 of the copper pillar 24 as oriented and depicted in FIG. 1. In an embodiment, the distal end 36 is between about 30 µm to about 80 µm. The mounted end 40 of the copper pillar 24, which is the ladder-shaped end closest to the substrate 12, defines a mount width 42. In an embodiment, the mount width 42 of the mounted end 40 is between about 40 µm to about 90 µm.

From the foregoing, it should be recognized that the mount width 42 is greater than the pillar width 38. This condition may be satisfied by, for example, making a mounted end 40 of the copper pillar 24 larger relative to the distal end 36. This condition may also be satisfied by, for example, making the distal end 36 of the copper pillar 24 smaller relative to the mounted end 40 as shown in FIG. 2.

One skilled in the art will recognize that it is not desirable to increase the pitch between adjacent bumps. This means that the pillar width 38 of the distal end 36 should not be increased beyond design dimensions. Hence, in order to get the truncated cone structure for the copper pillar 24, the mount width 42 of the mounted end 40 should be increased in order to obtain the advantageous structure. The wider mount width 42 of the mounted end 40 may also serve to lessen the possibility of delamination between the copper pillar 24 and the polyimide layer 20 and may also serve to lessen stress impact on underlying layers such as underlying ELK layers (e.g., insulating layer 14).

Figure 2:
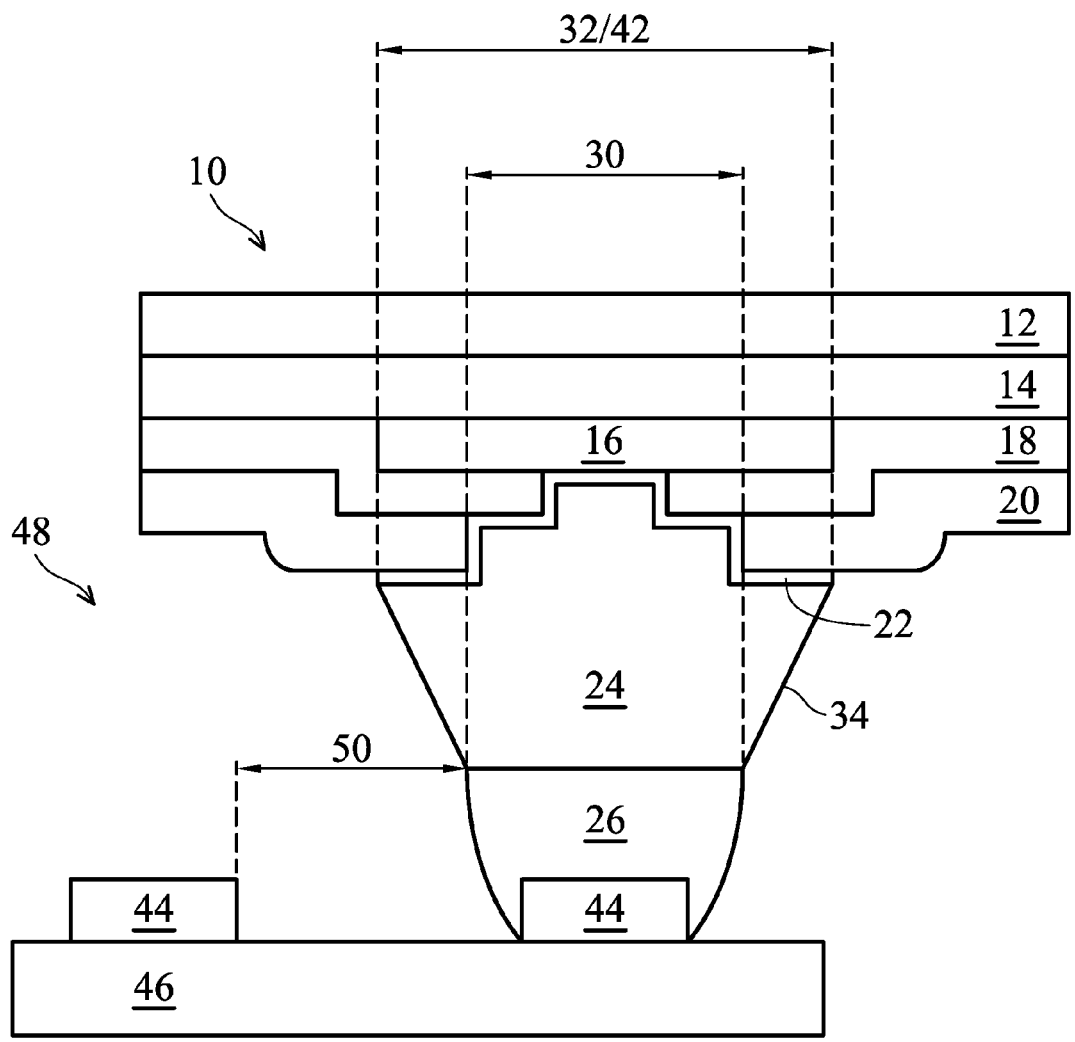
FIG. 2 is a cross sectional view of an embodiment ladder structure electrically coupled to a substrate trace to form a bump on trace (BOT) assembly.

The copper pillar 24 generally has a tapering or sloped profile as depicted in FIGS. 1-2. Indeed, the copper pillar 24 generally has the shape of a truncated cone. In an embodiment, the sidewalls 34 of the copper pillar 24 are linear from the distal end 36 to the mounted end 40 along an entire height (i.e., or length) of the sidewalls 34 of the copper pillar 24.

In an embodiment, a photolithography process is used to shape the copper pillar 24 as shown in FIGS. 1-2. Indeed, in the photolithography process a photoresist may be shaped appropriately in order to produce the copper pillar 24 in the form illustrated in FIGS. 1-2. The ladder profile maybe created by suitable techniques such as the use of multiple photoresist layers with different properties or multiple exposures using different masks.

Still referring to FIG. 1, the solder feature 26 is mounted on or over the copper pillar 24. In an embodiment, the solder feature 26 may be a ball, a bump, or the like, that may be contacted to another electrical device and reflowed to electrically bond the two devices together. By way of example, the solder feature 26 may be connected to a trace 44 on another device 46 (i.e., package, integrated circuit, etc.) and reflowed to produce a ball on trace (BOT) assembly 48 as shown in FIG. 2. Notably, the sloped sidewalls 34 of the copper pillar 24 provide a sufficient distance 50 between the adjacent trace 42 to prevent undesirable bridging.

Another advantageous feature of the illustrated embodiment is shown in FIG. 2. This figure illustrates the connection between the BOT assembly 48 and the trace 44 on the underlying device 46 to which the integrated circuit of substrate 12 has been electrically connected. Device 46 could be, e.g., another integrated circuit device, an interposer, a PCB (Printed Circuit Board), or the like. By having the truncated cone shape, the pillar width 38 of the top of copper pillar 24 is less than the mount width 42 of the bottom of copper pillar 24, as discussed above.

This means that, for a given spacing of adjacent bumps (not shown) on substrate 46, the spacing (i.e. the pitch) between adjacent tops of the bumps is greater. FIG. 2 illustrates that traces 44 on underlying device 46 can be placed closer together, for a given pitch of bumps on substrate 46 with a truncated cone shape then would be possible if the mount width 42 of the mounted end 40 at the top of the bump was the same as the pillar width 38 of the distal end 36 at the bottom of the bump. This feature allows for a tighter spacing of traces 44 and for minimizing the possibility of bridging or shorting between adjacent bump/trace joints.

One skilled in the art will recognize that the specific dimensions for the various widths and spacing discussed herein are matters of design choice and are dependent upon the particular technology node, and application employed.

Another advantageous feature of the present disclosure is that the width of the opening 30 in the polyimide layer 20 is wider than the width of the opening 28 in the passivation layer 18 as shown in FIG. 1. The wide opening 30 provides for a low contact resistance (Rc) and may also contribute to low stress impact on the underlying passivation layer 18. As illustrated, the combination of openings 30, 28 gives copper pillar 24 or bump a ladder profile or stair step profile.

In addition, in an embodiment, the pillar width 38 is greater than the polyimide opening 30. Also, in an embodiment the pillar width 38 is greater than the passivation opening 28. In an embodiment, a ratio of the pillar width 38 to the UBM width 32 is between about 0.75 to about 0.97. In an embodiment, a ratio of the passivation opening 28 to the polyimide opening 30 is between about 0.2 to about 0.5. In an embodiment, a ratio of the polyimide opening 30 to the UBM width 32 is between about 0.2 to about 0.7.

Still referring to FIG. 1, in an embodiment, the UBM width 32 is greater than the pillar width 38, the pillar width 38 is greater than the polyimide opening 30, and the polyimide opening 30 is greater than the passivation opening 28. In addition, the contact element 16 is larger than the polyimide opening 30 and the passivation opening 28. Also, in an embodiment the contact element 16 is approximately the same size as the pillar width 38 but smaller than the UBM width 32.

Figure 3:
FIG. 3 is a chart illustrating stress modeling for the embodiment ladder bump structures of FIGS. 1-2.

Referring now to FIG. 3, a chart 52 illustrating stress modeling for the embodiment ladder bump structures of FIGS. 1-2 is provided. As represented in FIG. 3, when the ratio of the polyimide opening 30 relative to the UBM width 32 (which is labeled Ratio of PIO(04)/UMB(05)) is between about 0.2 to about 0.7 (see the shaded boxes), the stress on the insulating layer 14 (i.e., the extremely low-k dielectric)

and the UBM feature 22 are relatively low. In addition, when the ratio of the passivation opening 28 relative to the polyimide opening 30 (which is labeled Ratio of Passivation (03)/PIO(04)) is between about 0.2 to about 0.5 (see the shaded boxes), the stress on the passivation layer 18 is relatively low.

Figure 4:
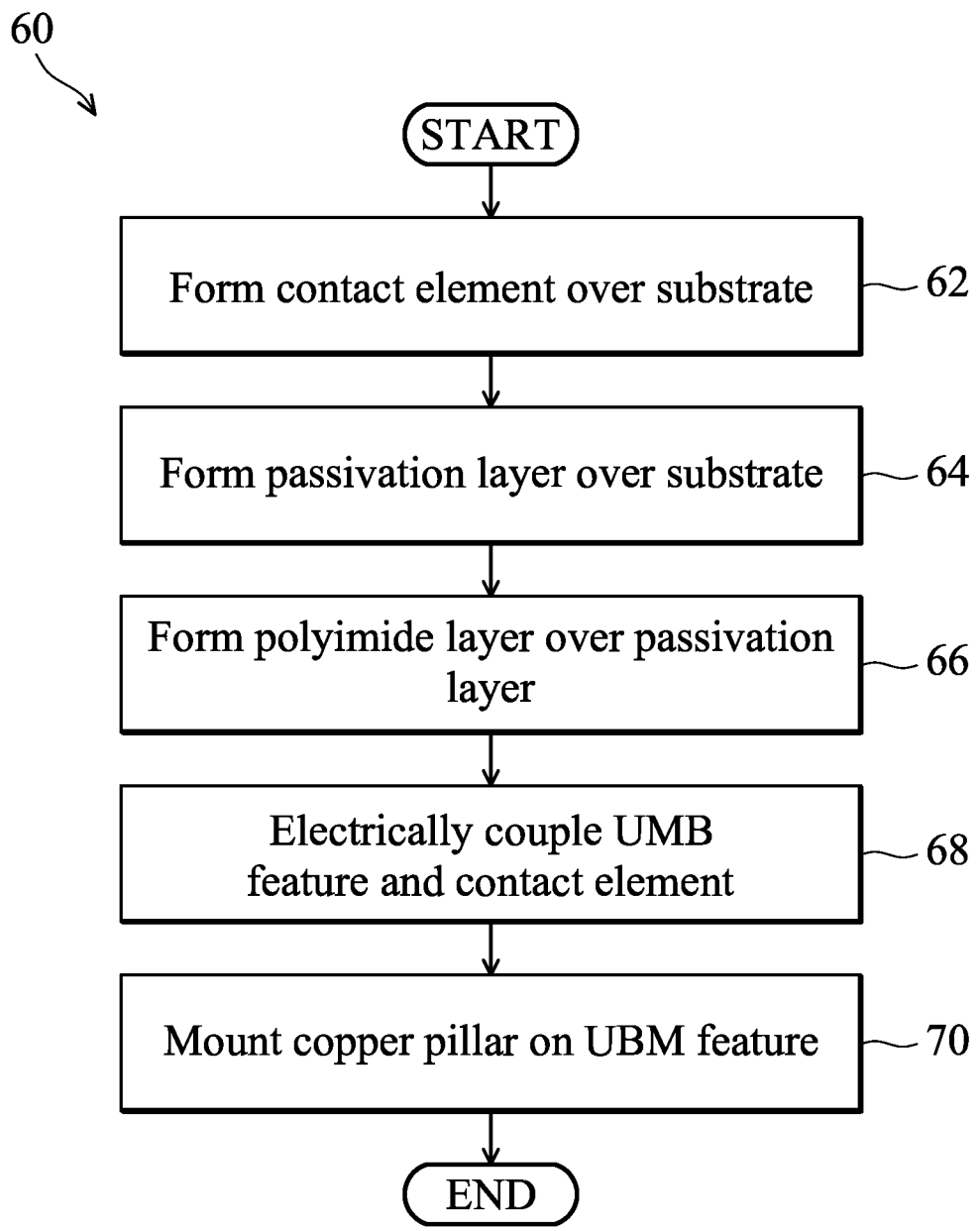
FIG. 4 is a flow diagram illustrating a method of forming the embodiment ladder structure of FIG. 1.

Referring now to FIG. 4, a method 60 of forming the embodiment ladder bump structure 10 of FIG. 1 is provided. In block 62, a contact element 16 is formed over the substrate 12. In block 64, a passivation layer is formed over the substrate 12. The passivation layer 18 includes the passivation opening 28 to expose the contact element 16. In block 66, the polyimide layer 20 is formed over the passivation layer 18. The polyimide layer 20 includes the polyimide opening 30 to expose the contact element 16.

In block 68, the UBM feature 22 is electrically coupled with the contact element 16. As noted above, the UBM feature 22 defines the UBM width 32. In block 70, the copper pillar 24 is formed on the UBM feature 22. The distal end 36 of the copper pillar 24 defines the pillar width 38. The UBM width 32 is greater than (i.e., larger) than the pillar width 38. In an embodiment, the solder feature is then mounted over the top of the copper pillar 24.

From the foregoing it should be recognized that embodiment bump ladder structures 10 provide advantageous features. For example, the bump structure (i.e., ladder bump structure) is created for fine pitch bump on trace (BOT) assembly 48 without undesirably bridging. In addition, the embodiment bump ladder structures 10 provide more bump cell design flexibility, provide low stress impact on the layer of silicon, extremely low-k dielectric, passivation, and so on. Moreover, the embodiment bump ladder structures 10 provide lower contact resistance (Rc), and a ladder structure for the copper pillar 24. Also, the embodiment bump ladder structures 10 inhibit or prevent delamination of the extremely low-k dielectric and cracking of the passivation layer 18 and the UBM feature 22. Still further, the embodiment bump ladder structures 10 provide a good assembly yield.

The following references are related to subject matter of the present application. Each of these references is incorporated herein by reference in its entirety:

U.S. Publication No. 2011/0285023 of Shen, et al. filed on Nov. 24, 2011, entitled "Substrate Interconnections Having Different Sizes."

An embodiment bump structure includes a contact element formed over a substrate, a passivation layer overlying the substrate, the passivation layer having a passivation opening exposing the contact element, a polyimide layer overlying the passivation layer, the polyimide layer having a polyimide opening exposing the contact element, an under bump metallurgy (UBM) feature electrically coupled to the contact element, the under bump metallurgy feature having a UBM width, and a copper pillar on the under bump metallurgy feature, a distal end of the copper pillar having a pillar width, the UBM width greater than the pillar width.

An embodiment bump structure includes a contact element formed over a substrate, a passivation layer overlying the substrate, the passivation layer having a passivation opening exposing the contact element, a polyimide layer overlying the passivation layer, the polyimide layer having a polyimide opening exposing the contact element, the polyimide opening greater than the passivation opening, an under bump metallurgy (UBM) feature overlying portions of the polyimide layer and the passivation layer and electrically coupled with the contact element, and a copper pillar on the under bump metallurgy feature.

An embodiment method of forming a bump structure includes forming a contact element over a substrate, forming a passivation layer over the substrate, the passivation layer having a passivation opening exposing the contact element, forming a polyimide layer over the passivation layer, the polyimide layer having a polyimide opening exposing the contact element, electrically coupling an under bump metallurgy (UBM) feature with the contact element, the under bump metallurgy feature having a UBM width, and forming a copper pillar on the under bump metallurgy feature, a distal end of the copper pillar having a pillar width, the UBM width greater than the pillar width.

In accordance with an embodiment, a bump structure includes a conductive contact element formed over a substrate. The conductive contact element having a linear interface with a conductive contact pad, a first portion extending through a passivation layer overlying the conductive contact pad, a second portion extending through an insulating layer overlying the passivation layer, and a third portion extending above the insulating layer. The first portion has a first diameter, the second portion has a second diameter greater than the first diameter, and the third portion has a diameter, which transitions smoothly from a third diameter to a fourth diameter. The third diameter is greater than the second diameter, and the fourth diameter is less than the third diameter and greater than the first diameter In accordance with another embodiment, a method includes forming a contact element over a substrate, forming a passivation layer over the substrate, and forming an insulating layer over the passivation layer. The passivation layer has a passivation opening exposing the contact element, and the insulating layer has an insulating opening exposing the contact element. The method further includes electrically coupling an under bump metallurgy (UBM) feature with the contact element, and forming a conductive pillar on the UBM feature and having a flat interface with the UBM feature. The conductive pillar has sloped sidewalls extending from a top surface of the UBM feature to a top surface of the conductive pillar, wherein a diameter of the conductive pillar is greater at the top surface of the UBM feature than at the top surface of the conductive pillar. The UBM feature has a UBM width.

In accordance with an embodiment, a device includes a contact element formed over a substrate, a passivation layer overlying the substrate, and an insulating layer overlying the passivation layer. The passivation layer has a first opening therein having a first diameter, and the insulating layer has a second opening therein having a second diameter greater than the first diameter. The device further includes an under bump metallurgy (UBM) lining the first opening and the second opening and electrically coupled with the contact element and a conductive pillar extending into the first opening and second opening.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bump structure, comprising:
   an under bump metallurgy (UBM) over a semiconductor substrate and comprising a substantially linear interface with a conductive contact pad disposed between the UBM and the semiconductor substrate; and a conductive contact element formed over the UBM, wherein the UBM is disposed between the conductive contact element and the conductive contact pad, and wherein, the conductive contact element comprises:
- a first portion extending at least partially through a passivation layer overlying the conductive contact pad, the first portion having a first diameter, wherein a sidewall of the first portion is substantially linear,
- a second portion extending through an insulating layer overlying the passivation layer, wherein the second portion has a second diameter greater than the first diameter, and
- a third portion extending above the insulating layer and away from the semiconductor substrate, the third portion having a diameter that transitions from a third diameter to a fourth diameter, the third diameter being greater than the second diameter, and the fourth diameter being less than the third diameter and greater than the first diameter.

2. The bump structure of claim 1, wherein the fourth diameter is greater than the second diameter.

3. The bump structure of claim 1, wherein the fourth diameter is substantially equal to the second diameter.

4. The bump structure of claim 1, wherein the UBM forms the substantially linear interface with the conductive contact pad.

5. The bump structure of claim 4, wherein the UBM extends through the passivation layer and the insulating layer, and wherein a portion of the UBM is disposed on a lateral surface of the insulating layer.

6. The bump structure of claim 4, wherein the UBM has a fifth diameter substantially equal to the third diameter.

7. The bump structure of claim 1, wherein a portion of the third portion comprises a substantially linear profile.

8. The bump structure of claim 1, wherein a ratio of the fourth diameter to the third diameter is between about 0.75 to about 0.97.

9. A method comprising:
forming a contact element over a substrate;
forming a passivation layer over the substrate, the passivation layer having a passivation opening exposing the contact element;
forming an insulating layer over the passivation layer, the insulating layer having an insulating opening exposing the contact element;
electrically coupling an under bump metallurgy (UBM) feature with the contact element; and
forming a conductive pillar on the UBM feature and having a flat interface with the UBM feature, the conductive pillar having sloped and substantially linear sidewalls extending from a top surface of the UBM feature to a top surface of the conductive pillar, wherein a diameter of the conductive pillar at the top surface of the UBM feature is greater than a diameter of the conductive pillar at the top surface of the conductive pillar.

10. The method of claim 9 further comprising forming a solder ball on the top surface of the conductive pillar.

11. The method of claim 10 further comprising bonding the solder ball to a substrate trace, wherein the substrate trace is formed on a top surface of a semiconductor device.

12. The method of claim 11, wherein a distance between the substrate trace and an adjacent trace is less than a distance between the conductive pillar and an adjacent conductive pillar.

13. The method of claim 9, wherein electrically coupling the UBM feature comprises extending the UBM feature through the passivation layer and the insulating layer.

14. The method of claim 9, wherein the UBM feature has a UBM width, wherein a ratio of a passivation width of the passivation opening to a insulating width of the insulating opening is between about 0.2 to about 0.5 and a ratio of the insulating width to the UBM width is between about 0.2 to about 0.7.

15. A device comprising:
a contact element formed over a substrate;
a passivation layer overlying the substrate, the passivation layer having a first opening therein having a first diameter;
an insulating layer overlying the passivation layer, the insulating layer having a second opening therein having a second diameter greater than the first diameter;
an under bump metallurgy (UBM) lining the first opening and the second opening and electrically coupled with the contact element; and
a conductive pillar extending into the first opening and second opening, wherein a sidewall of the conductive pillar is sloped and substantially linear.

16. The device of claim 15 further comprising a substrate trace bonded to the conductive pillar by a solder ball, wherein the solder ball is disposed on the conductive pillar.

17. The device of claim 16, wherein a distance between the substrate trace and an adjacent substrate trace is less than a distance between the conductive pillar and an adjacent conductive pillar.

18. The device of claim 16, wherein the solder ball is disposed on a top surface and sidewalls of the substrate trace.

19. The device of claim 15, wherein the insulating layer is a polyimide layer, and wherein the conductive pillar is a copper pillar.

20. The device of claim 15, wherein a portion of the conductive pillar extending past the insulating layer comprises a truncated-cone shape.

* * * * *